US012751092B2

(12) United States Patent
Chen et al.

(10) Patent No.: US 12,751,092 B2
(45) Date of Patent: Sep. 29, 2026

(54) ELECTROSTATIC DISCHARGE (ESD) PROTECTION DEVICE

(71) Applicant: AMAZING MICROELECTRONIC CORP., New Taipei City (TW)

(72) Inventors: Chih-Wei Chen, Zhubei City (TW); Che-Hao Chuang, Jhudong Township (TW); Kun-Hsien Lin, Hsinchu City (TW)

(73) Assignee: AMAZING MICROELECTRONIC CORP., New Taipei City (TW)

( * ) Notice: Subject to any disclaimer, the term of this patent is extended or adjusted under 35 U.S.C. 154(b) by 371 days.

(21) Appl. No.: 18/373,173

(22) Filed: Sep. 26, 2023

(65) Prior Publication Data

US 2025/0107245 A1 Mar. 27, 2025

(51) Int. Cl.

*H10D 89/60* (2025.01)
*H02H 1/00* (2006.01)
*H02H 9/04* (2006.01)

(52) U.S. Cl.

CPC ........ *H10D 89/713* (2025.01); *H02H 1/0007* (2013.01); *H02H 9/046* (2013.01)

(58) Field of Classification Search

CPC ........................... H10D 89/713; H02H 1/0007
See application file for complete search history.

(56) References Cited

U.S. PATENT DOCUMENTS

| | | | | |
|---|---|---|---|---|
| 5,572,394 | A | 11/1996 | Ker et al. | |
| 10,685,954 | B1 | 6/2020 | Shen et al. | |
| 10,692,855 | B2 * | 6/2020 | Lin | H01L 23/528 |
| 10,985,155 | B1 * | 4/2021 | Lin | H10D 89/819 |
| 2014/0167106 | A1 * | 6/2014 | Salcedo | H10D 89/713<br>257/146 |
| 2021/0098445 | A1 * | 4/2021 | Lin | H10D 18/40 |
| 2023/0223398 | A1 | 7/2023 | Chen et al. | |

FOREIGN PATENT DOCUMENTS

| | | | |
|---|---|---|---|
| TW | 201929222 | A | 7/2019 |
| TW | 202114136 | A | 4/2021 |

* cited by examiner

*Primary Examiner* — Steven M Page
(74) *Attorney, Agent, or Firm* — Birch, Stewart, Kolasch & Birch, LLP

(57) ABSTRACT

An electrostatic discharge protection device includes a P-type substrate, an N-type well, a first P-type heavily-doped area, an N-type doped area, and a first N-type heavily-doped area. The N-type well is formed in the P-type substrate. The first P-type heavily-doped area is formed in the N-type well. The N-type doped area and the first N-type heavily-doped area are formed in the P-type substrate. The N-type doped area is coupled to the N-type well through an external conductive wire decoupled to the first P-type heavily-doped area. Alternatively, the P-type substrate and the N-type well are respectively replaced with an N-type substrate and a P-type well.

16 Claims, 19 Drawing Sheets

ELECTROSTATIC DISCHARGE (ESD) PROTECTION DEVICE

BACKGROUND OF THE INVENTION

Field of the Invention

The present invention relates to a protection device, particularly to an electrostatic discharge (ESD) protection device.

Description of the Related Art

As the IC device sizes have been shrunk to nanometer scale, the consumer electronics, like the laptop and mobile devices, have been designed to be much smaller than ever. Without suitable protection devices, the functions of these electronics could be reset or even damaged under electrostatic discharge (ESD) events. Currently, all consumer electronics are expected to pass the ESD test requirement of IEC 61000-4-2 standard. Transient voltage suppressor (TVS) is generally designed to bypass the ESD energy, so that the electronic systems can be prevented from ESD damages.

The working principle of TVS is shown in FIG. 1. In FIG. 1, a transient voltage suppression (TVS) device 10 is connected in parallel with a protected circuit 12 on the printed circuit board (PCB). The transient voltage suppression device 10 would be triggered immediately when the ESD event occurs. In that way, the transient voltage suppression device 10 can provide a superiorly low resistance path for discharging the transient ESD current, so that the energy of the ESD transient current can be bypassed by the transient voltage suppression device 10. As shown in FIG. 2, the conventional low-voltage silicon-controlled rectifier (LVTSCR) includes a P-type substrate 14, an N-type doped well 16, three N-type heavily-doped areas 18, 20, and 22, and two P-type heavily-doped areas 24 and 26. The N-type doped well 16 is formed in the P-type substrate 14. The N-type heavily-doped area 18 and the P-type heavily-doped area 24 are formed in the N-type doped well 16 and coupled to a first pin 28. The N-type heavily-doped area 20 is formed in the N-type doped well 16 and the P-type substrate 14. The N-type heavily-doped area 22 and the P-type heavily-doped area 26 are formed in the P-type substrate 14. The N-type heavily-doped area 22 and the P-type heavily-doped area 26 are coupled to a second pin. The second pin is also coupled to a gate 32 of the N-channel metal-oxide-semiconductor field-effect transistor (NMOSFET) device. The gate 32 is formed on an area between the N-type heavily-doped areas 20 and 22 through a dielectric layer. The LVTSCR mainly has parasitic capacitances formed by the P-type substrate 14, the N-type doped well 16, and the N-type heavily-doped area 20. Since the N-type doped well 16 is coupled to the first pin 28 through the N-type heavily-doped area 18, the parasitic capacitance is very high due to the large area of an interface between the P-type substrate 14 and the N-type doped well 16. The LVTSCR is turned on due to the breakdown event occurring at an interface between the N-type heavily-doped area 20 and the P-type substrate 14. An N-channel metal-oxide-semiconductor field-effect transistor (NMOSFET) formed by the N-type heavily-doped areas 20 and 22 and the gate 32 is formed in a path of turning on the LVTSCR, thereby increasing a path between the first pin 28 and the second pin 30 and the clamping voltage of the LVTSCR. In addition, the P-type heavily-doped area 26 coupled to the second pin 30 is far from the breakdown interface between the N-type heavily-doped area 20 and the P-type substrate 14. Thus, the LVTSCR merely requires a low trigger current to be turned on. The low trigger current LVTSCR is easy to be accidentally triggered by noise or surge in an external environment, thereby leading to the malfunction of the electronic system or integrated circuit (IC).

To overcome the above mentioned problems, the present invention provides an electrostatic discharge (ESD) protection device, so as to solve the afore-mentioned problems of the prior art.

SUMMARY OF THE INVENTION

The present invention provides an electrostatic discharge (ESD) protection device, which has a low parasitic capacitance, a low clamping voltage, a low trigger voltage, and a high trigger current.

The present invention provides an electrostatic discharge (ESD) protection device, which includes a P-type substrate, an N-type well, a first P-type heavily-doped area, an N-type doped area, and a first N-type heavily-doped area. The N-type well is formed in the P-type substrate. The first P-type heavily-doped area is formed in the N-type well. The N-type doped area and the first N-type heavily-doped area are formed in the P-type substrate. The N-type doped area is coupled to the N-type well through an external conductive wire and the external conductive wire is decoupled to the first P-type heavily-doped area.

In an embodiment of the present invention, the first P-type heavily-doped area is coupled to a first pin and the first pin is decoupled to the external conductive wire. The first N-type heavily-doped area and the P-type substrate are coupled to a second pin.

In an embodiment of the present invention, the first N-type heavily-doped area is formed between the N-type doped area and the N-type well.

In an embodiment of the present invention, the electrostatic discharge protection device further includes a second N-type heavily-doped area formed in the N-type well. The second N-type heavily-doped area is coupled to the N-type doped area through the external conductive wire.

In an embodiment of the present invention, the electrostatic discharge protection device further includes a second P-type heavily-doped area formed in the P-type substrate. The N-type doped area is formed between the first N-type heavily-doped area and the second P-type heavily-doped area.

In an embodiment of the present invention, the electrostatic discharge protection device further includes a P-type well formed in the P-type substrate. The doping concentration of the P-type well is greater than the doping concentration of the P-type substrate and less than the doping concentration of the second P-type heavily-doped area. The second P-type heavily-doped area is formed in the P-type well. The P-type well is directly contiguous to the N-type doped area.

In an embodiment of the present invention, the P-type substrate has a region between the N-type doped area and the first N-type heavily-doped area. A dielectric layer and a conductive gate are sequentially formed on the region. The conductive gate is coupled to the external conductive wire.

In an embodiment of the present invention, the P-type substrate has a region between the N-type doped area and the first N-type heavily-doped area. A dielectric layer and a conductive gate are sequentially formed on the region. The conductive gate is coupled to the first N-type heavily-doped area.

In an embodiment of the present invention, the electrostatic discharge protection device further includes an electrostatic discharge (ESD) detection circuit. The P-type substrate has a region between the N-type doped area and the first N-type heavily-doped area. A dielectric layer and a conductive gate are sequentially formed on the region. The ESD detection circuit is coupled to the external conductive wire, the conductive gate, and the first N-type heavily-doped area. The first P-type heavily-doped area is coupled to a first pin, and the first N-type heavily-doped area is coupled to a second pin and also coupled to a reference voltage. When the first pin receives a positive electrostatic discharge (ESD) voltage higher than the reference voltage, the ESD detection circuit turns on a parasitic field-effect transistor formed by the dielectric layer, the conductive gate, the N-type doped area, the P-type substrate, and the first N-type heavily-doped area in response to the positive ESD voltage.

In an embodiment of the present invention, the ESD detection circuit includes an inverter, a resistor, and a capacitor. The output of the inverter is coupled to the conductive gate. The resistor is coupled between the external conductive wire and the input of the inverter. The capacitor is coupled between the input of the inverter and the reference voltage.

The present invention provides an electrostatic discharge (ESD) protection device, which includes an N-type substrate, a P-type well, a first P-type heavily-doped area, an N-type doped area and a first N-type heavily-doped area. The P-type well is formed in the N-type substrate. The first P-type heavily-doped area is formed in the N-type substrate. The N-type doped area and the first N-type heavily-doped area are formed in the P-type well. The N-type doped area is coupled to the N-type substrate through an external conductive wire and the external conductive wire is decoupled to the first P-type heavily-doped area.

In an embodiment of the present invention, the first P-type heavily-doped area is coupled to a first pin, and the first pin is decoupled to the external conductive wire. The first N-type heavily-doped area and the P-type well are coupled to a second pin.

In an embodiment of the present invention, the first N-type heavily-doped area is formed between the N-type doped area and the first P-type heavily-doped area.

In an embodiment of the present invention, the electrostatic discharge protection device further includes a second N-type heavily-doped area formed in the N-type substrate. The second N-type heavily-doped area is coupled to the N-type doped area through the external conductive wire.

In an embodiment of the present invention, the electrostatic discharge protection device further includes a second P-type heavily-doped area formed in the P-type well. The N-type doped area is formed between the first N-type heavily-doped area and the second P-type heavily-doped area.

In an embodiment of the present invention, the P-type well has a region between the N-type doped area and the first N-type heavily-doped area. A dielectric layer and a conductive gate are sequentially formed on the region. The conductive gate is coupled to the external conductive wire.

In an embodiment of the present invention, the P-type well has a region between the N-type doped area and the first N-type heavily-doped area. A dielectric layer and a conductive gate are sequentially formed on the region. The conductive gate is coupled to the first N-type heavily-doped area.

In an embodiment of the present invention, the electrostatic discharge protection device further includes an electrostatic discharge (ESD) detection circuit. The P-type well has a region between the N-type doped area and the first N-type heavily-doped area. A dielectric layer and a conductive gate are sequentially formed on the region. The ESD detection circuit is coupled to the external conductive wire, the conductive gate, and the first N-type heavily-doped area. The first P-type heavily-doped area is coupled to a first pin, and the first N-type heavily-doped area is coupled to a second pin and also coupled to a reference voltage. When the first pin receives a positive electrostatic discharge (ESD) voltage higher than the reference voltage, the ESD detection circuit turns on a parasitic field-effect transistor formed by the dielectric layer, the conductive gate, the N-type doped area, the P-type well, and the first N-type heavily-doped area in response to the positive ESD voltage.

To sum up, the electrostatic discharge (ESD) protection device couples the N-type well or the N-type substrate to the N-type doped area to have a low parasitic capacitance, a low clamping voltage, a low trigger voltage, and a high trigger current.

Below, the embodiments are described in detail in cooperation with the drawings to make easily understood the technical contents, characteristics and accomplishments of the present invention.

DETAILED DESCRIPTION OF THE INVENTION

Figure 1:
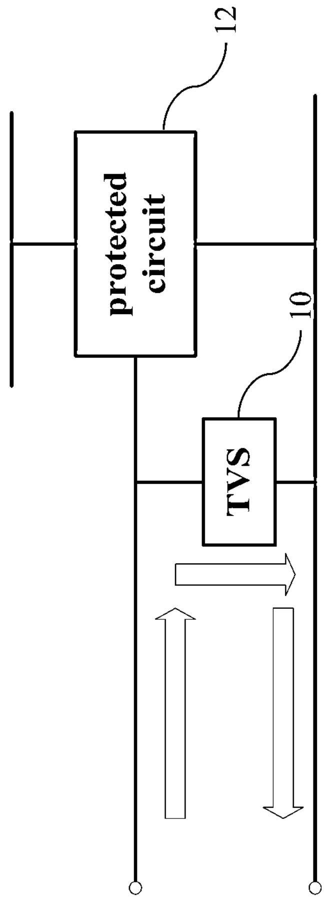
Fig.1 (prior art)
FIG. 1 is a schematic diagram illustrating a transient voltage suppression device connected with a protected circuit on an IC chip in the conventional technology.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Unless otherwise specified, some conditional sentences or words, such as "can", "could", "might", or "may", usually attempt to express what the embodiment in the present invention has, but it can also be interpreted as a feature, element, or step that may not be needed. In other embodiments, these features, elements, or steps may not be required.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Certain terms are used throughout the description and the claims to refer to particular components. One skilled in the art appreciates that a component may be referred to using different names. This disclosure does not intend to distinguish between components that differ in name but not in function. In the description and in the claims, the term "comprise" is used in an open-ended fashion, and thus should be interpreted to mean "include, but not limited to." The phrases "be coupled with," "couples with," and "coupling with" are intended to encompass any indirect or direct connection. Accordingly, if this disclosure mentions that a first device is coupled with a second device, it means that the first device may be directly or indirectly connected to the second device through electrical connections, wireless communications, optical communications, or other signal connections with/without other intermediate devices or connection means.

The invention is particularly described with the following examples which are only for instance. Those skilled in the art will readily observe that numerous modifications and alterations of the device and method may be made while retaining the teachings of the invention. Accordingly, the following disclosure should be construed as limited only by the metes and bounds of the appended claims. In the whole patent application and the claims, except for clearly described content, the meaning of the articles "a" and "the" includes the meaning of "one or at least one" of the elements or components. Moreover, in the whole patent application and the claims, except that the plurality can be excluded obviously according to the context, the singular articles also contain the description for the plurality of elements or components. In the entire specification and claims, unless the contents clearly specify the meaning of some terms, the meaning of the article "wherein" includes the meaning of the articles "wherein" and "whereon". The meanings of every term used in the present claims and specification refer to a usual meaning known to one skilled in the art unless the meaning is additionally annotated. Some terms used to describe the invention will be discussed to guide practitioners about the invention. The examples in the present specification do not limit the claimed scope of the invention.

A conventional low trigger current silicon-controlled rectifier (SCR) is easy to be accidentally triggered by noise or surge in an external environment. When the SCR is turned on, its low holding voltage and low holding current will affect the signal integrity, thereby leading to malfunction of the electronic system or integrated circuit (IC). Therefore, increasing the trigger current of SCR can effectively reduce the chance of SCR falsely triggered. In the following description, an electrostatic discharge (ESD) protection device will be described. The electrostatic discharge protection device couples an N-type well or an N-type substrate to an N-type doped area to have a low parasitic capacitance, a low clamping voltage, a low trigger voltage, and a high trigger current.

Figure 3:
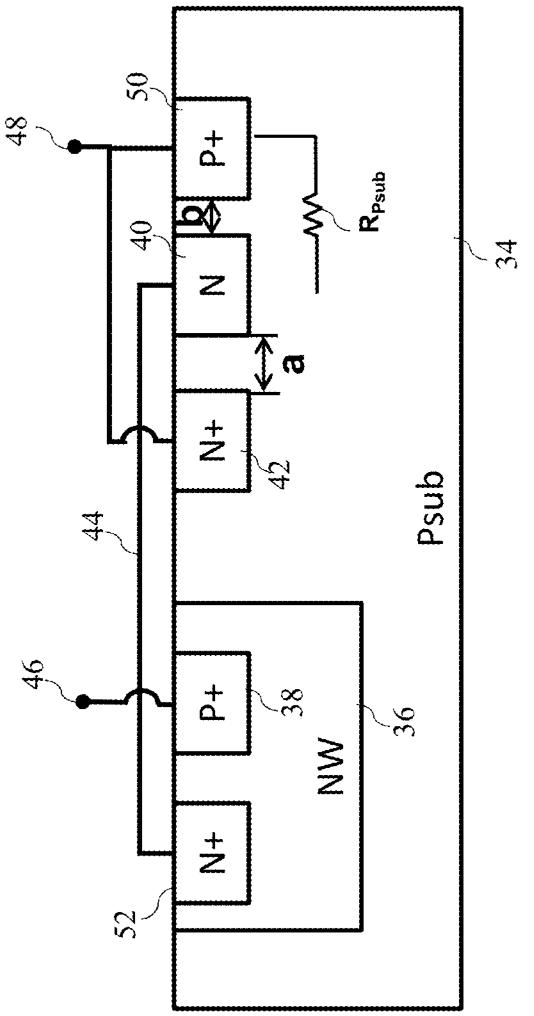
FIG. 3 is a cross-sectional view of an electrostatic discharge (ESD) protection device according to a first embodiment of the present invention.

FIG. 3 is a cross-sectional view of an electrostatic discharge (ESD) protection device according to a first embodiment of the present invention. Referring to FIG. 3, the first embodiment of the electrostatic discharge protection device is introduced as follows. The electrostatic discharge protection device includes a P-type substrate 34, an N-type well 36, a first P-type heavily-doped area 38, an N-type doped area 40, and a first N-type heavily-doped area 42. The N-type well 36 is formed in the P-type substrate 34. The first P-type heavily-doped area 38 is formed in the N-type well 36. The N-type doped area 40 and the first N-type heavily-doped area 42 are formed in the P-type substrate 34. The N-type doped area 40 is coupled to the N-type well 36 through an external conductive wire 44 and the external conductive wire 44 is decoupled to the first P-type heavily-doped area 38. The first P-type heavily-doped area 38 may be coupled to a first pin 46. The first N-type heavily-doped area 42 may be coupled to a second pin 48. The first pin 46 is decoupled to the external conductive wire 44. The first P-type heavily-doped area 38, the N-type well 36, the P-type substrate 34, and the first N-type heavily-doped area 42 form a silicon-controlled rectifier (SCR).

The N-type well 36 is an N-type lightly-doped well, an interface between the N-type well 36 and the P-type substrate 34 has a high breakdown voltage. In order to reduce the trigger voltage of the SCR, the doping concentration of the N-type doped area 40 is adjusted to be higher or a distance a between the N-type doped area 40 and the first N-type heavily-doped area 42 is reduced. In a preferred embodiment, the doping concentration of the N-type doped area 40 is higher than that of the N-type well 36. When the doping concentration of the N-type doped area 40 is adjusted to be higher or a distance a between the N-type doped area 40 and the first N-type heavily-doped area 42 is reduced, the punch through voltage of a bipolar junction transistor formed by the N-type doped area 40, the P-type substrate 34, and the first N-type heavily-doped area 42 is decreased, thereby reducing the trigger voltage of the SCR. When the first pin 46 receive a positive ESD voltage and the second pin 48 is grounded, an ESD current firstly flows from the first pin 46 to the second pin 48 through the first P-type heavily-doped area 38, the N-type well 36, the external conductive wire 44, the N-type doped area 40, the P-type substrate 34, and the first N-type heavily-doped area 42. The positive ESD voltage breakdowns the interface between the N-type doped area 40 and the P-type substrate 34 to firstly turn on the parasitic bipolar junction transistor formed by the N-type well 36, P-type substrate 34, and the first N-type heavily-doped area 42. Then, the SCR formed by the first P-type heavily-doped area 38, the N-type well 36, the P-type substrate 34, and the first N-type heavily-doped area 42 is continually turned on. Finally, the ESD current is bypassed from the first pin 46 to the second pin 48 through the first P-type heavily-doped area 38, the N-type well 36, the P-type substrate 34, and the first N-type heavily-doped area 42. In some embodiments of the present invention, the first N-type heavily-doped area 42 is formed between the N-type doped area 40 and the N-type well 36 in order to have the short turned-on distance of the SCR path between the first pin 46 and the second pin 48. In such a case, the first N-type heavily-doped area 42 is close to the N-type well 36 as much as possible. When the SCR steadily bypasses the ESD current, the ESD current does not flow through the N-type doped area 40. In addition, the total parasitic capacitance of the SCR is dominated by the parasitic capacitance formed by the first P-type heavily-doped area 38 and the N-type well 36. A parasitic capacitance formed by the first P-type heavily-doped area 38 and the N-type well 36 is low since an interface between the first P-type heavily-doped area 38 and the N-type well 36 has a smaller area and the N-type well 36 has a lower doping concentration. Accordingly, the SCR has a low clamping voltage, a low turned-on resistance, and a low parasitic capacitance.

In order to stabilize the voltage of the P-type substrate 34, the P-type substrate 34 may be coupled to the second pin 48. In some embodiments of the present invention, the electrostatic discharge protection device may further include a second P-type heavily-doped area 50 formed in the P-type substrate 34. The N-type doped area 40 is formed between the first N-type heavily-doped area 42 and the second P-type heavily-doped area 50. The second P-type heavily-doped area 50 is coupled to the second pin 48 to form an ohmic contact. When the positive ESD voltage breakdowns the interface between the N-type doped area 40 and the P-type substrate 34, the ESD current also flows to the second pin 48 through the second P-type heavily-doped area 50. Since the second P-type heavily-doped area 50 is close to the breakdown interface between the N-type doped area 40 and the P-type substrate 34, the parasitic resistance $R_{Psub}$ of the P-type substrate 34 between the N-type doped area 40 and the second P-type heavily-doped area 50 is low. That is to say, the SCR requires a higher trigger current to be turned on. As a matter of fact, a distance b between the N-type doped area 40 and the second P-type heavily-doped area 50 is adjustable. When the distance b between the N-type doped area 40 and the second P-type heavily-doped area 50 is short, the parasitic resistance $R_{Psub}$ is low. When the distance b between the N-type doped area 40 and the second P-type heavily-doped area 50 is long, the parasitic resistance $R_{Psub}$ is high. As a result, the SCR has an adjustable trigger current. In such a case, the parasitic resistance $R_{Psub}$ is low so that the SCR requires a high trigger current to be turned on, thereby effectively reducing the chance of the SCR falsely triggered. In some embodiments of the present invention, the electrostatic discharge protection device may further include a second N-type heavily-doped area 52 formed in the N-type well 36 and the second N-type heavily-doped area 52 is coupled to the N-type doped area 40 through the external conductive wire 44 to form an ohmic contact. The second N-type heavily-doped area 52 is provided for the passage of the ESD current.

Figure 2:
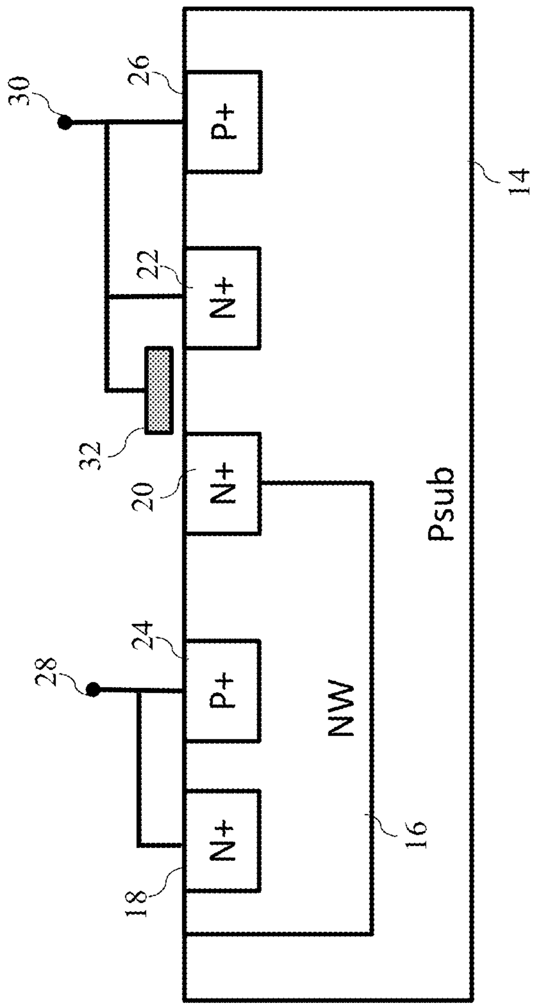
Fig.2 (prior art)
FIG. 2 is a cross-sectional view of a low-voltage silicon-controlled rectifier (LVTSCR) in the conventional technology.
Figure 4:
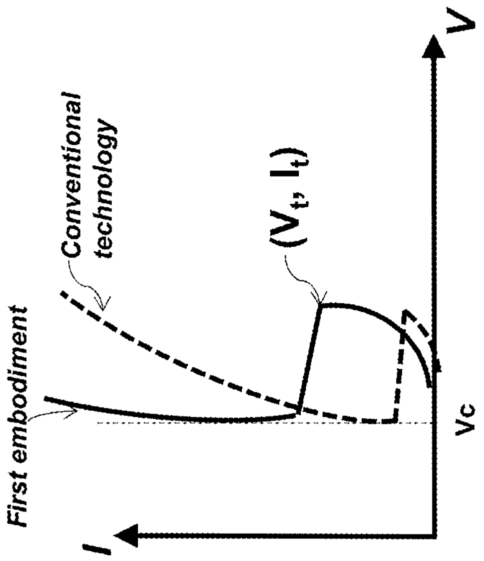
FIG. 4 is a diagram illustrating the curves of current versus voltage of the electrostatic discharge protection of FIG. 3 and the low-voltage silicon-controlled rectifier of FIG. 2.

FIG. 4 is a diagram illustrating the curves of current versus voltage of the electrostatic discharge protection of FIG. 3 and the low-voltage silicon-controlled rectifier of FIG. 2. As illustrated in FIG. 4, a solid line represents the electrostatic discharge protection of FIG. 3 and a dashed line represents the low-voltage silicon-controlled rectifier of FIG. 2. Form FIG. 4, it is known that both of the low-voltage silicon-controlled rectifier and the electrostatic discharge protection have a low trigger voltage $V_t$. Compared to the low-voltage silicon-controlled rectifier, the electrostatic discharge protection has a higher trigger current $I_t$ and a lower clamping voltage Vc.

Figure 5:
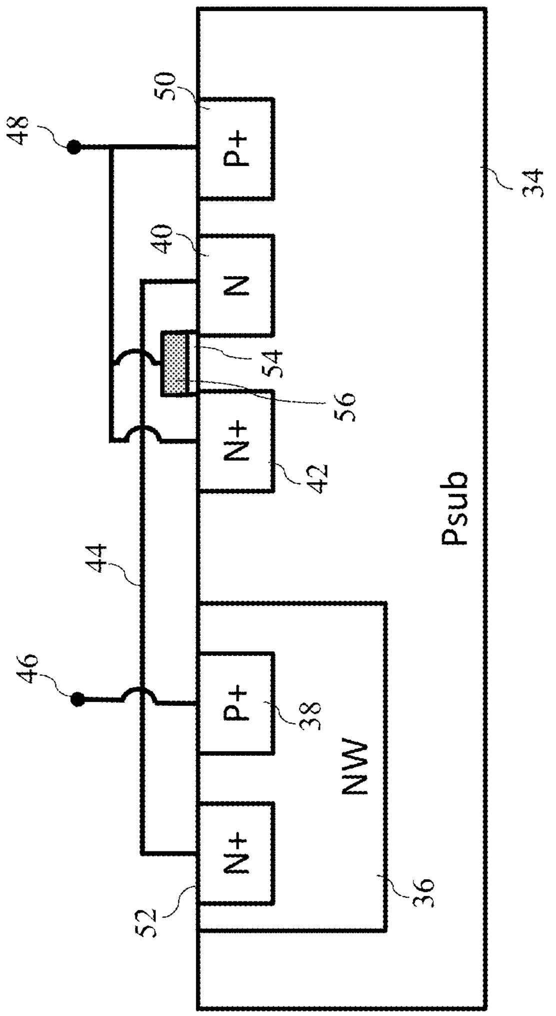
FIG. 5 is a cross-sectional view of an electrostatic discharge protection device according to a second embodiment of the present invention.

FIG. 5 is a cross-sectional view of an electrostatic discharge protection device according to a second embodiment of the present invention. Referring to FIG. 5, the second embodiment of the electrostatic discharge protection device is introduced as follows. The second embodiment is different from the first embodiment in that the P-type substrate 34 of the second embodiment has a region between the N-type doped area 40 and the first N-type heavily-doped area 42. A dielectric layer 54 and a conductive gate 56 are sequentially formed on the region of the P-type substrate 34. The conductive gate 56 is coupled to the second pin 48 and the first N-type heavily-doped area 42. When the positive ESD voltage is applied to the first pin 46 and the second pin 48 is grounded, the leakage current passing through the region between the N-type doped area 40 and the first N-type heavily-doped area 42 can be prevented. The other features of the second embodiment have been described in the first embodiment previously so they will not be reiterated.

Figure 6:
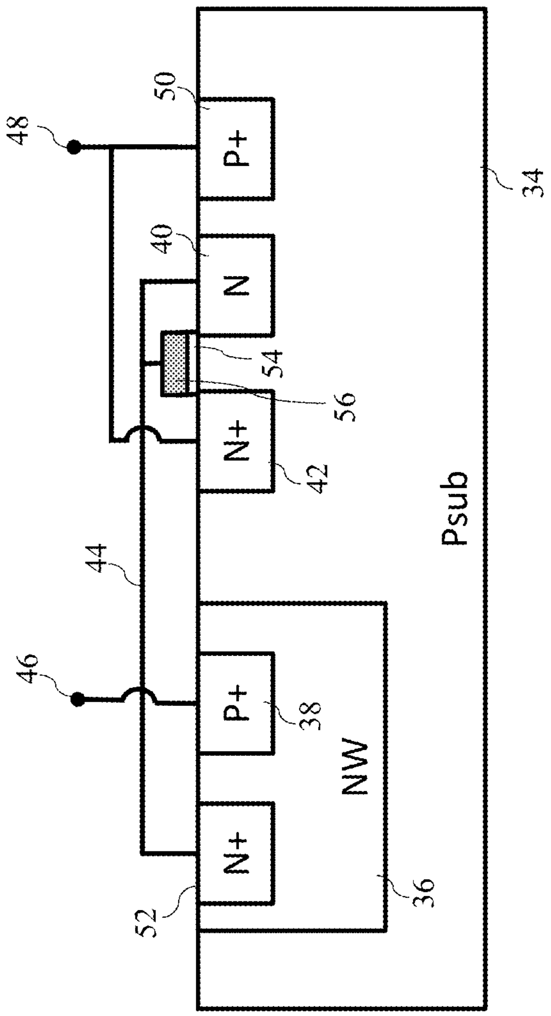
FIG. 6 is a cross-sectional view of an electrostatic discharge protection device according to a third embodiment of the present invention.

FIG. 6 is a cross-sectional view of an electrostatic discharge protection device according to a third embodiment of the present invention. Referring to FIG. 6, the third embodiment of the electrostatic discharge protection device is introduced as follows. The third embodiment is different from the first embodiment in that the P-type substrate 34 of the third embodiment has a region between the N-type doped area 40 and the first N-type heavily-doped area 42. A dielectric layer 54 and a conductive gate 56 are sequentially formed on the region of the P-type substrate 34. The conductive gate 56 is coupled to the external conductive wire 44. When the positive ESD voltage is applied to the first pin 46 and the second pin 48 is grounded, the positive ESD voltage helps turn on a parasitic field-effect transistor formed by the dielectric layer 54, the conductive gate 56, the N-type doped area 40, the P-type substrate 34, and the first N-type heavily-doped area 42, thereby decreasing the trigger voltage of the SCR. The other features of the third embodiment have been described in the first embodiment previously so they will not be reiterated.

Figure 7:
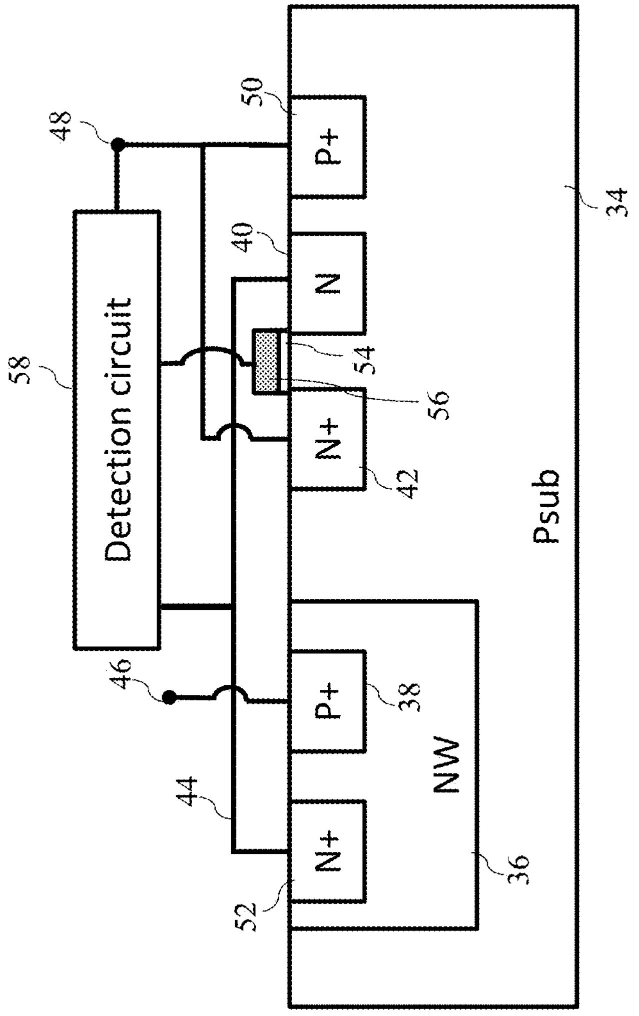
FIG. 7 is a cross-sectional view of an electrostatic discharge protection device according to a fourth embodiment of the present invention.

FIG. 7 is a cross-sectional view of an electrostatic discharge protection device according to a fourth embodiment of the present invention. Referring to FIG. 7, the fourth embodiment of the electrostatic discharge protection device is introduced as follows. The fourth embodiment is different from the first embodiment in that the P-type substrate 34 of the fourth embodiment has a region between the N-type doped area 40 and the first N-type heavily-doped area 42. A dielectric layer 54 and a conductive gate 56 are sequentially formed on the region of the P-type substrate 34. In addition, the fourth embodiment further includes an electrostatic discharge (ESD) detection circuit 58 coupled to the external conductive wire 44, the conductive gate 56, and the first N-type heavily-doped area 42. The first P-type heavily-doped area 38 is coupled to a first pin 46. The first N-type heavily-doped area 42 is coupled to a second pin 48 and is also coupled to a reference voltage. In the fourth embodiment, a positive electrostatic discharge (ESD) voltage is applied to the first pin 46 and the second pin 48 is grounded. When the first pin 46 receives the positive ESD voltage higher than the grounding voltage as the reference voltage, the ESD detection circuit 58 turns on a parasitic field-effect transistor formed by the dielectric layer 54, the conductive gate 56, the N-type doped area 40, the P-type substrate 34, and the first N-type heavily-doped area 42 in response to the positive ESD voltage, thereby decreasing the trigger voltage of the SCR. The ESD detection circuit 58 can improve the sensitivity of bypassing the ESD current. When the first P-type heavily-doped area 38 receives an input voltage lower than or equal to the grounding voltage as the reference voltage through the first pin 46, the detection circuit 58 turns off the parasitic field-effect transistor formed by the dielectric layer 54, the conductive gate 56, the N-type doped area 40, the P-type substrate 34, and the first N-type heavily-doped area 42 in response to the input voltage. The other features of the fourth embodiment have been described in the first embodiment previously so they will not be reiterated.

Figure 8:
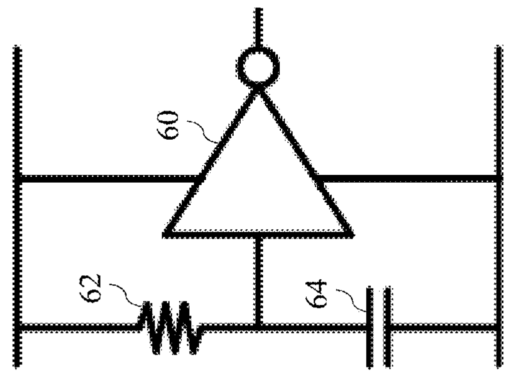
FIG. 8 is a schematic diagram illustrating an electrostatic discharge (ESD) detection circuit according to an embodiment of the present invention.

FIG. 8 is a schematic diagram illustrating an ESD detection circuit according to an embodiment of the present invention. Referring to FIG. 7 and FIG. 8, the detection circuit 58 may include an inverter 60, a resistor 62, and a capacitor 64. The output of the inverter 60 is coupled to the conductive gate 56. The resistor 62 is coupled between the external conductive wire 44 and the input of the inverter 60. The capacitor 64 is coupled between the input of the inverter 60 and the grounding voltage as the reference voltage. In such a case, the capacitor 64 is coupled to the second pin 48. In order to bypass the ESD current, a time constant formed by the resistor 62 and the capacitor 64 has 0.1~1 μs.

Figure 9:
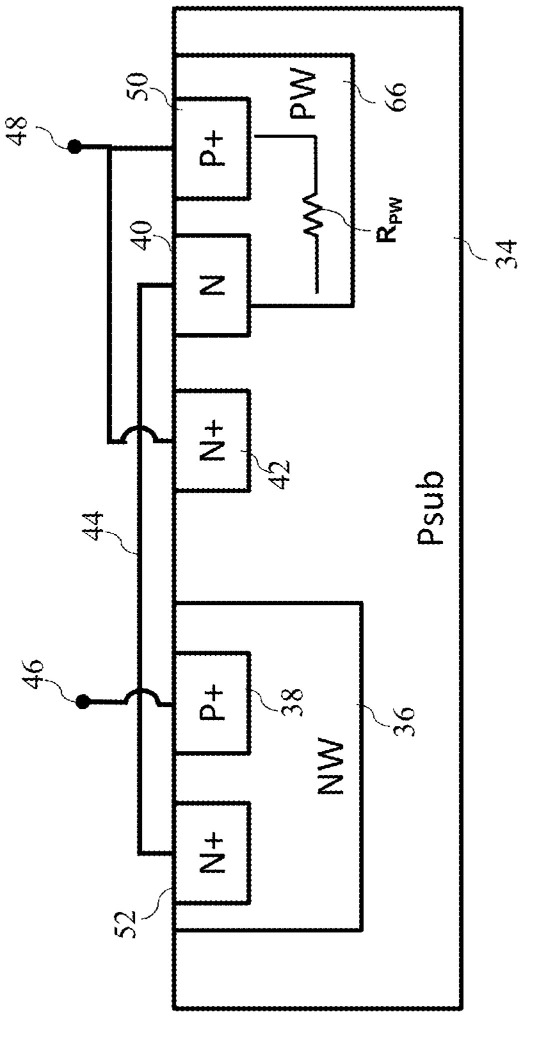
FIG. 9 is a cross-sectional view of an electrostatic discharge protection device according to a fifth embodiment of the present invention.

FIG. 9 is a cross-sectional view of an electrostatic discharge protection device according to a fifth embodiment of the present invention. Referring to FIG. 9 and FIG. 3, the fifth embodiment of the electrostatic discharge protection device is introduced as follows. The fifth embodiment is different from the first embodiment in that the fifth embodiment further includes a P-type well 66 formed in the P-type substrate 34. The doping concentration of the P-type well 66 is greater than the doping concentration of the P-type substrate 34 and less than the doping concentration of the second P-type heavily-doped area 50. The second P-type heavily-doped area 50 is formed in the P-type well 66. The P-type well 66 is directly contiguous to the N-type doped area 40. The parasitic resistance $R_{PW}$ of the P-type well 66 between the N-type doped area 40 and the second P-type heavily-doped area 50 is lower than the parasitic resistance $R_{Psub}$ of the P-type substrate 34 between the N-type doped area 40 and the second P-type heavily-doped area 50. In order to reduce the parasitic resistance $R_{PW}$ of the P-type well 66, the bottom of the P-type well 66 may be deeper than that of each of the N-type doped area 40 and the second P-type heavily-doped area 50. Compared with the SCR of the first embodiment, the SCR of the fifth embodiment requires a higher trigger current to be turned on because the parasitic resistance $R_{PW}$ is lower than the parasitic resistance $R_{Psub}$. The other features of the ffith embodiment have been described in the first embodiment previously so they will not be reiterated.

Figure 10:
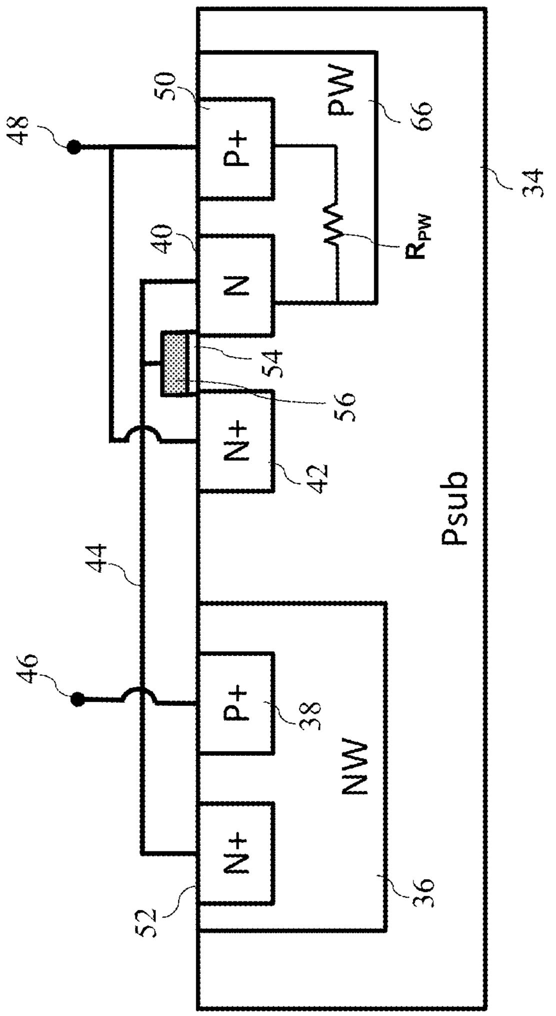
FIG. 10 is a cross-sectional view of an electrostatic discharge protection device according to a sixth embodiment of the present invention.

FIG. 10 is a cross-sectional view of an electrostatic discharge protection device according to a sixth embodiment of the present invention. Referring to FIG. 10 and FIG. 6, the sixth embodiment of the electrostatic discharge protection device is introduced as follows. The sixth embodiment is different from the third embodiment in that the sixth embodiment further includes a P-type well 66 formed in the P-type substrate 34. The doping concentration of the P-type well 66 is greater than the doping concentration of the P-type substrate 34 and less than the doping concentration of the second P-type heavily-doped area 50. The second P-type heavily-doped area 50 is formed in the P-type well 66. The P-type well 66 is directly contiguous to the first N-type heavily-doped area 42. The parasitic resistance $R_{PW}$ of the P-type well 66 between the N-type doped area 40 and the second P-type heavily-doped area 50 is lower than the parasitic resistance of the P-type substrate 34 between the N-type doped area 40 and the second P-type heavily-doped area 50. In order to reduce the parasitic resistance $R_{PW}$ of the P-type well 66, the bottom of the P-type well 66 may be deeper than that of each of the N-type doped area 40 and the second P-type heavily-doped area 50. Compared with the SCR of the third embodiment, the SCR of the sixth embodiment requires a higher trigger current to be turned on because the parasitic resistance $R_{PW}$ is lower than the parasitic resistance $R_{Psub}$. The other features of the sixth embodiment have been described in the third embodiment previously so they will not be reiterated.

Figure 11:
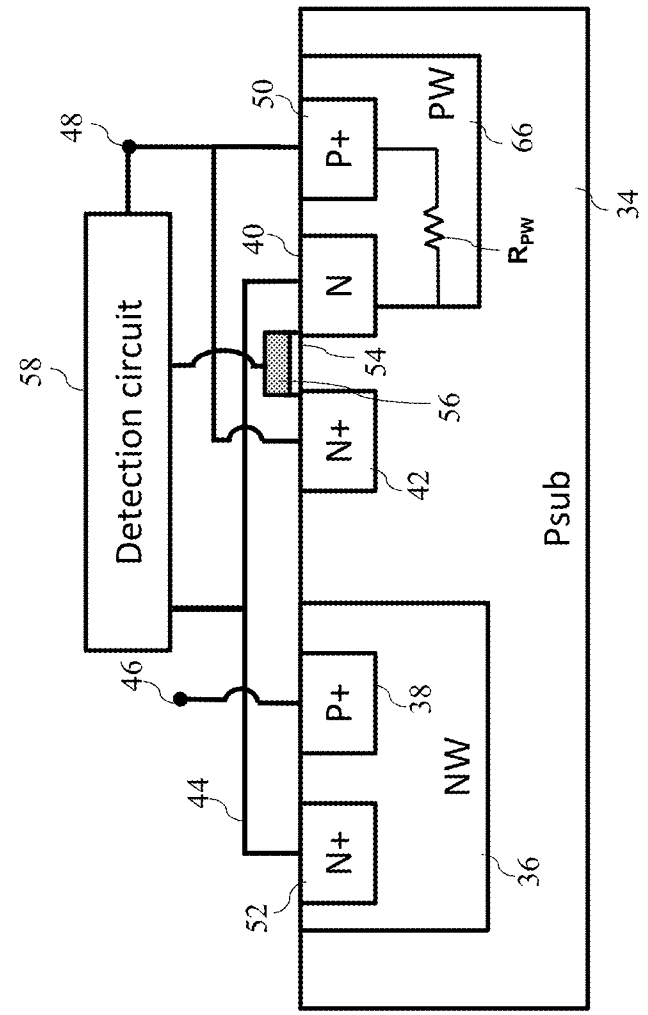
FIG. 11 is a cross-sectional view of an electrostatic discharge protection device according to a seventh embodiment of the present invention.

FIG. 11 is a cross-sectional view of an electrostatic discharge protection device according to a seventh embodiment of the present invention. Referring to FIG. 11 and FIG. 7, the seventh embodiment of the electrostatic discharge protection device is introduced as follows. The seventh embodiment is different from the fourth embodiment in that the seventh embodiment further includes a P-type well 66 formed in the P-type substrate 34. The doping concentration of the P-type well 66 is greater than the doping concentration of the P-type substrate 34 and less than the doping concentration of the second P-type heavily-doped area 50. The second P-type heavily-doped area 50 is formed in the P-type well 66. The P-type well 66 is directly contiguous to the first N-type heavily-doped area 42. The parasitic resistance $R_{PW}$ of the P-type well 66 between the N-type doped area 40 and the second P-type heavily-doped area 50 is lower than the parasitic resistance of the P-type substrate 34 between the N-type doped area 40 and the second P-type heavily-doped area 50. In order to reduce the parasitic resistance $R_{PW}$ of the P-type well 66, the bottom of the P-type well 66 may be deeper than that of each of the N-type doped area 40 and the second P-type heavily-doped area 50. Compared with the SCR of the fourth embodiment, the SCR of the seventh embodiment requires a higher trigger current to be turned on because the parasitic resistance $R_{PW}$ is lower than the parasitic resistance $R_{Psub}$. The other features of the seventh embodiment have been described in the fourth embodiment previously so they will not be reiterated.

Figure 12:
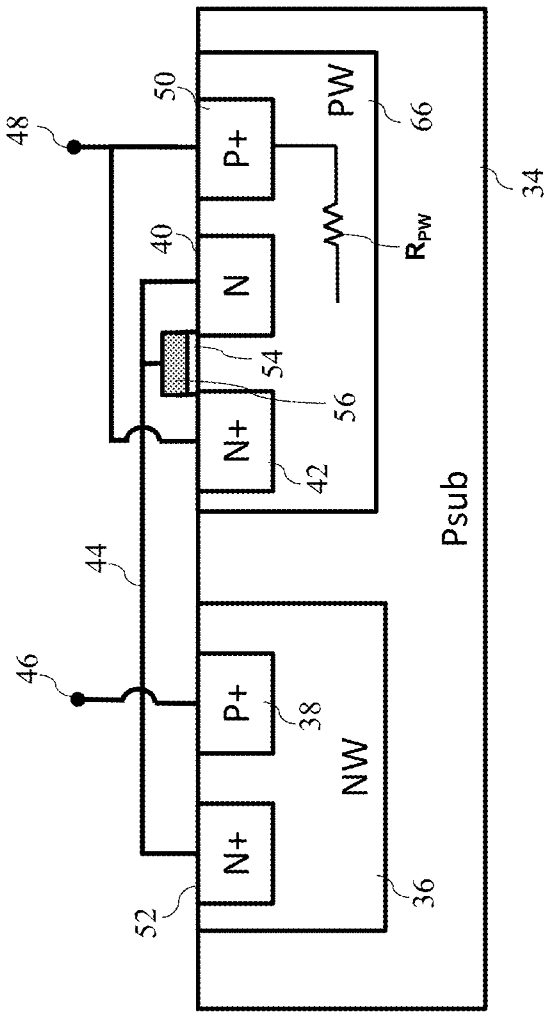
FIG. 12 is a cross-sectional view of an electrostatic discharge protection device according to an eighth embodiment of the present invention.

FIG. 12 is a cross-sectional view of an electrostatic discharge protection device according to an eighth embodiment of the present invention. Referring to FIG. 12, the eighth embodiment of the electrostatic discharge protection device is introduced as follows. The eighth embodiment is different from the sixth embodiment in the P-type well 66. In the eighth embodiment, the first N-type heavily-doped area 42 and the N-type doped area 40 are formed in the P-type well 66. The other features of the eighth embodiment have been described in the sixth embodiment previously so they will not be reiterated.

Figure 13:
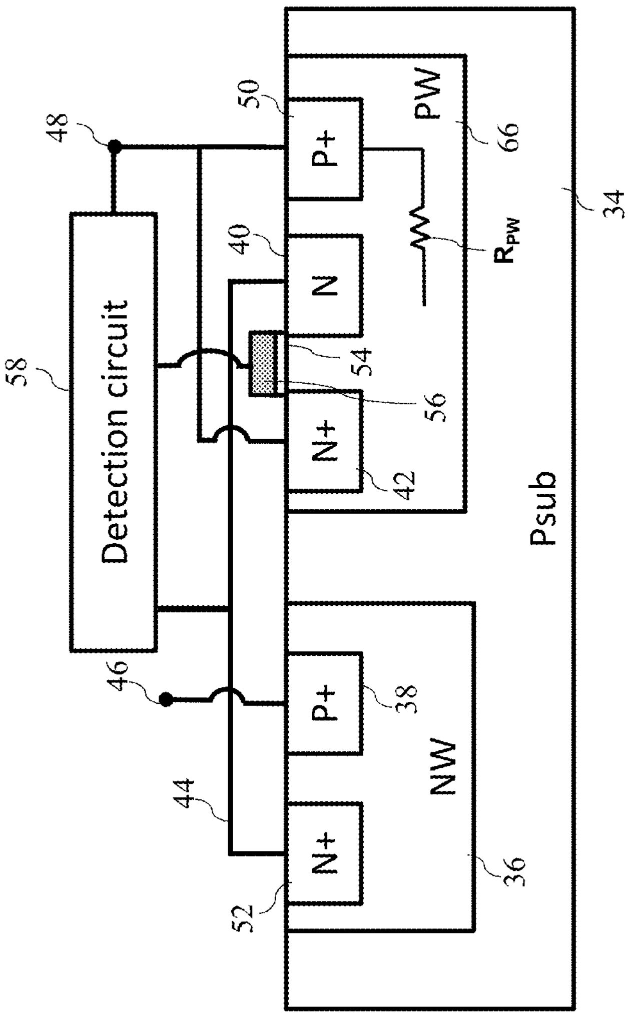
FIG. 13 is a cross-sectional view of an electrostatic discharge protection device according to a ninth embodiment of the present invention.

FIG. 13 is a cross-sectional view of an electrostatic discharge protection device according to a ninth embodiment of the present invention. Referring to FIG. 13, the ninth embodiment of the electrostatic discharge protection device is introduced as follows. The ninth embodiment is different from the seventh embodiment in the P-type well 66. In the ninth embodiment, the first N-type heavily-doped area 42 and the N-type doped area 40 are formed in the P-type well 66. The other features of the ninth embodiment have been described in the seventh embodiment previously so they will not be reiterated.

Figure 14:
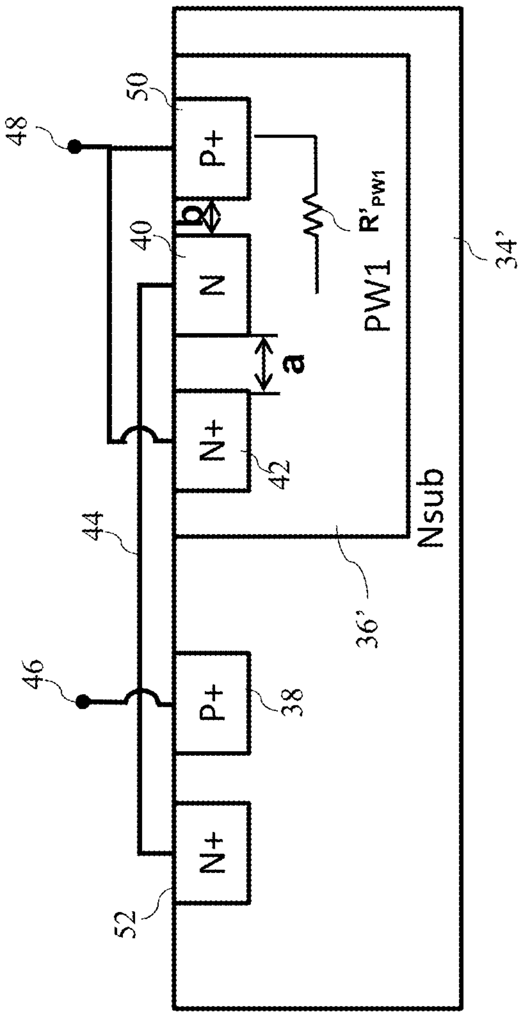
FIG. 14 is a cross-sectional view of an electrostatic discharge protection device according to a tenth embodiment of the present invention.

FIG. 14 is a cross-sectional view of an electrostatic discharge protection device according to a tenth embodiment of the present invention. Referring to FIG. 14, the tenth embodiment of the electrostatic discharge protection device is introduced as follows. The electrostatic discharge protection device includes an N-type substrate 34', a P-type well 36', a first P-type heavily-doped area 38, an N-type doped area 40, and a first N-type heavily-doped area 42. The P-type well 36' is formed in the N-type substrate 34'. The first P-type heavily-doped area 38 is formed in the N-type substrate 34'. The N-type doped area 40 and the first N-type heavily-doped area 42 are formed in the P-type well 36'. The N-type doped area 40 is coupled to the N-type substrate 34' through an external conductive wire 44 and the external conductive wire 44 is decoupled to the first P-type heavily-doped area 38. The first P-type heavily-doped area 38 may be coupled to the first pin 46. The first N-type heavily-doped area 42 may be coupled to a second pin 48. The first pin 46 is decoupled to the external conductive wire 44. The first P-type heavily-doped area 38, the N-type substrate 34', the P-type well 36', and the first N-type heavily-doped area 42 form a silicon-controlled rectifier (SCR).

Since the N-type substrate 34' is an N-type lightly-doped substrate, an interface between the N-type substrate 34' and the P-type well 36' has a higher breakdown voltage. In order to reduce the trigger voltage of the SCR, the doping concentration of the N-type doped area 40 is adjusted to be higher or a distance a between the N-type doped area 40 and the first N-type heavily-doped area 42 is reduced. In a preferred embodiment, the doping concentration of the N-type doped area 40 is higher than that of the N-type substrate 34'. When the doping concentration of the N-type doped area 40 is adjusted to be higher or a distance a between the N-type doped area 40 and the first N-type heavily-doped area 42 is reduced, the punch through voltage of a bipolar junction transistor formed by the N-type doped area 40, the P-type well 36', and the first N-type heavily-doped area 42 is decreased, thereby reducing the trigger voltage of the SCR. When the first pin 46 receive a positive ESD voltage and the second pin 48 is grounded, an ESD current firstly flows from the first pin 46 to the second pin 48 through the first P-type heavily-doped area 38, the N-type substrate 34', the external conductive wire 44, the N-type doped area 40, the P-type well 36', and the first N-type heavily-doped area 42. The positive ESD voltage breakdowns the interface between the N-type doped area 40 and the P-type well 36' to firstly turn on the parasitic bipolar junction transistor formed by the N-type doped area 40, the P-type well 36', and the first N-type heavily-doped area 42. Then, the SCR formed by the first P-type heavily-doped area 38, the N-type substrate 34', the P-type well 36', and the first N-type heavily-doped area 42 is continually turned on. Finally, the ESD current is bypassed from the first pin 46 to the second pin 48 through the first P-type heavily-doped area 38, the N-type substrate 34', the P-type well 36', and the first N-type heavily-doped area 42. In some embodiments of the present invention, the first N-type heavily-doped area 42 is formed between the N-type doped area 40 and the first P-type heavily-doped area 38 in order to have the short turned-on distance of the SCR path between the first pin 46 and the second pin 48. In such a case, the first N-type heavily-doped area 42 is close to the first P-type heavily-doped area 38 as much as possible. When the SCR steadily bypasses the ESD current, the ESD current does not flow through the N-type doped area 40. In addition, the total parasitic capacitance of the SCR is dominated by the parasitic capacitance formed by the first P-type heavily-doped area 38 and the N-type substrate 34'. A parasitic capacitance formed by the first P-type heavily-doped area 38 and the N-type substrate 34' is low since an interface between the first P-type heavily-doped area 38 and the N-type substrate 34' has a smaller area and the N-type substrate 34' has a lower doping concentration. Accordingly, the SCR has a low clamping voltage, a low turned-on resistance, and a low parasitic capacitance.

In order to stabilize the voltage of the P-type well 36', the P-type well 36' may be coupled to the second pin 48. In some embodiments of the present invention, the electrostatic discharge protection device may further include a second P-type heavily-doped area 50 formed in the P-type well 36'. The N-type doped area 40 is formed between the first N-type heavily-doped area 42 and the second P-type heavily-doped area 50. The second P-type heavily-doped area 50 is coupled to the second pin 48 to form an ohmic contact. When the positive ESD voltage breakdowns the interface between the N-type doped area 40 and the P-type well 36', the ESD current also flows to the second pin 48 through the second P-type heavily-doped area 50. Since the second P-type heavily-doped area 50 is close to the breakdown interface between the N-type doped area 40 and the P-type well 36', the parasitic resistance $R'_{PW1}$ of the P-type well 36' between the N-type doped area 40 and the second P-type heavily-doped area 50 is low. That is to say, the SCR requires a higher trigger current to be turned on. As a matter of fact, a distance b between the N-type doped area 40 and the second P-type heavily-doped area 50 is adjustable. When the distance b between the N-type doped area 40 and the second P-type heavily-doped area 50 is short, the parasitic resistance $R'_{PW1}$ is low. When the distance b between the N-type doped area 40 and the second P-type heavily-doped area 50 is long, the parasitic resistance $R'_{PW1}$ is high. As a result, the SCR has an adjustable trigger current. In such a case, the parasitic resistance $R'_{PW1}$ is low so that the SCR requires a high trigger current to be turned on, thereby effectively reducing the chance of the SCR falsely triggered. In some embodiments of the present invention, the electrostatic discharge protection device may further include a second N-type heavily-doped area 52 formed in the N-type substrate 34' and coupled to the N-type doped area 40 through the external conductive wire 44 to form an ohmic contact. The second N-type heavily-doped area 52 is provided for the passage of the ESD current.

Figure 15:
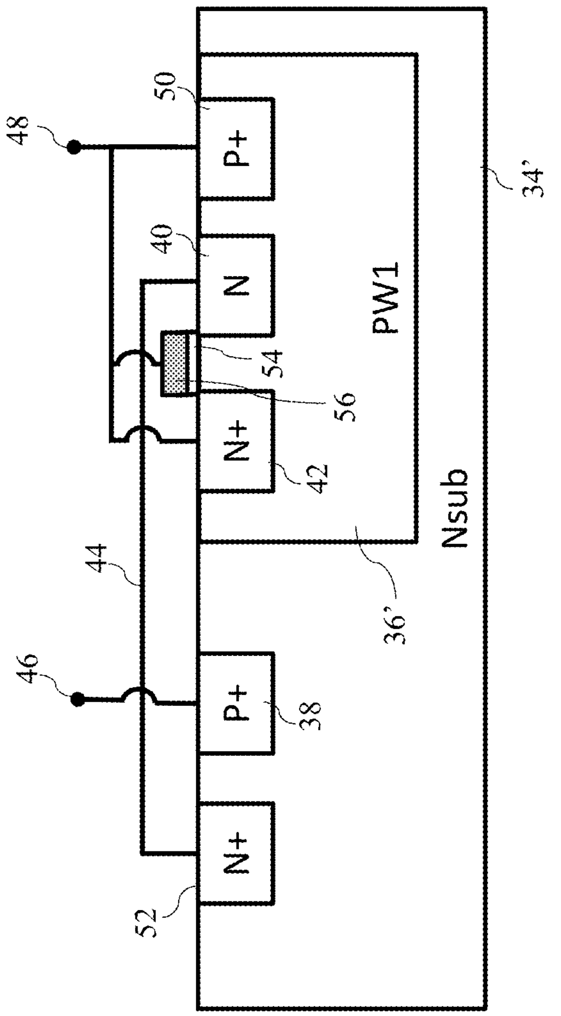
FIG. 15 is a cross-sectional view of an electrostatic discharge protection device according to an eleventh embodiment of the present invention.

FIG. 15 is a cross-sectional view of an electrostatic discharge protection device according to an eleventh embodiment of the present invention. Referring to FIG. 15, the eleventh embodiment of the electrostatic discharge protection device is introduced as follows. The eleventh embodiment is different from the tenth embodiment in that the P-type well 36' of the eleventh embodiment has a region between the N-type doped area 40 and the first N-type heavily-doped area 42. A dielectric layer 54 and a conductive gate 56 are sequentially formed on the region of the P-type well 36'. The conductive gate 56 is coupled to the second pin 48 and the first N-type heavily-doped area 42. When the positive ESD voltage is applied to the first pin 46 and the second pin 48 is grounded, the leakage current passing through the region between the N-type doped area 40 and the first N-type heavily-doped area 42 can be prevented. The other features of the eleventh embodiment have been described in the tenth embodiment previously so they will not be reiterated.

Figure 16:
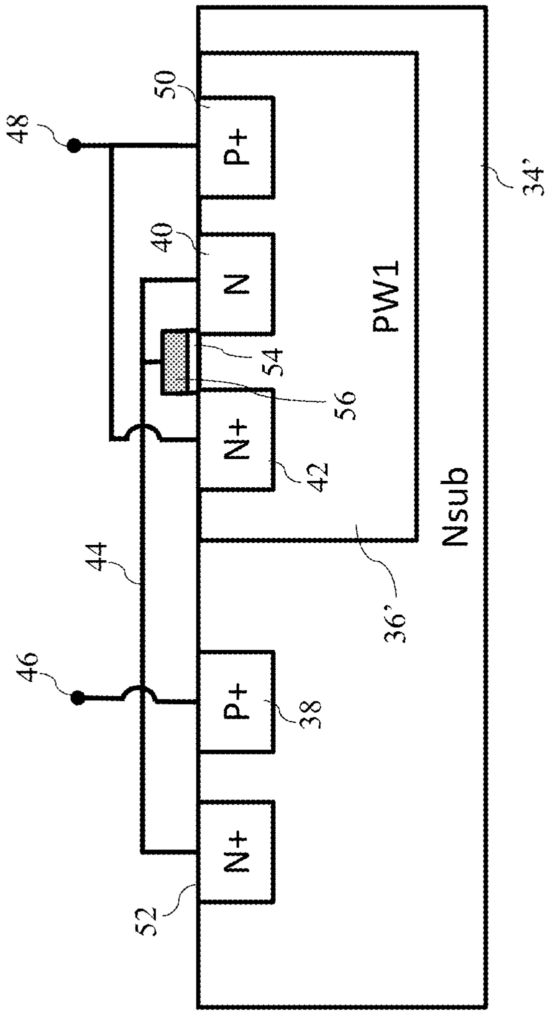
FIG. 16 is a cross-sectional view of an electrostatic discharge protection device according to a twelfth embodiment of the present invention.

FIG. 16 is a cross-sectional view of an electrostatic discharge protection device according to a twelfth embodiment of the present invention. Referring to FIG. 16, the twelfth embodiment of the electrostatic discharge protection device is introduced as follows. The twelfth embodiment is different from the tenth embodiment in that the P-type well 36' of the twelfth embodiment has a region between the N-type doped area 40 and the first N-type heavily-doped area 42. A dielectric layer 54 and a conductive gate 56 are sequentially formed on the region of the P-type well 36'. The conductive gate 56 is coupled to the external conductive wire 44. When the positive ESD voltage is applied to the first pin 46 and the second pin 48 is grounded, the positive ESD voltage helps turn on a parasitic field-effect transistor formed by the dielectric layer 54, the conductive gate 56, the N-type doped area 40, the P-type well 36', and the first N-type heavily-doped area 42, thereby decreasing the trigger voltage of the SCR. The other features of the twelfth embodiment have been described in the tenth embodiment previously so they will not be reiterated.

Figure 17:
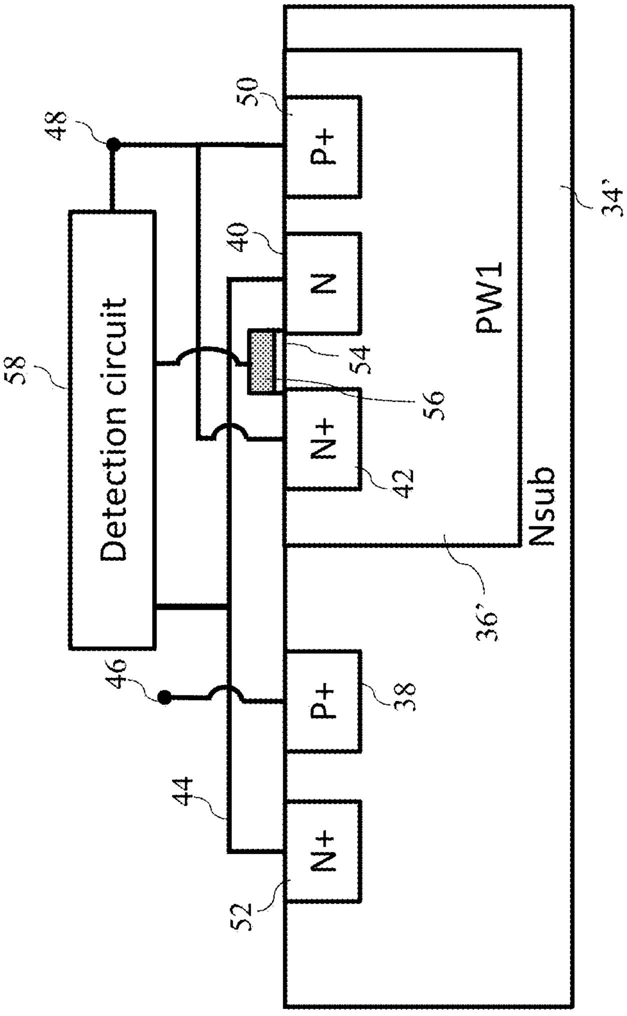
FIG. 17 is a cross-sectional view of an electrostatic discharge protection device according to a thirteenth embodiment of the present invention.

FIG. 17 is a cross-sectional view of an electrostatic discharge protection device according to a thirteenth embodiment of the present invention. Referring to FIG. 17, the thirteenth embodiment of the electrostatic discharge protection device is introduced as follows. The thirteenth embodiment is different from the tenth embodiment in that the P-type well 36' of the thirteenth embodiment has a region between the N-type doped area 40 and the first N-type heavily-doped area 42. A dielectric layer 54 and a conductive gate 56 are sequentially formed on the region of the P-type well 36'. In addition, the thirteenth embodiment further includes an ESD detection circuit 58 coupled to the external conductive wire 44, the conductive gate 56, and the first N-type heavily-doped area 42. The first P-type heavily-doped area 38 is coupled to a first pin 46. The first N-type heavily-doped area 42 is coupled to a second pin 48 and is also coupled to a reference voltage. In the thirteenth embodiment, a positive electrostatic discharge (ESD) voltage is applied to the first pin 46 and the second pin 48 is grounded. When the first pin 46 receives the positive ESD voltage higher than the grounding voltage as the reference voltage, the ESD detection circuit 58 turns on a parasitic field-effect transistor formed by the dielectric layer 54, the conductive gate 56, the N-type doped area 40, the P-type well 36', and the first N-type heavily-doped area 42 in response to the positive ESD voltage, thereby decreasing the trigger voltage of the SCR. The ESD detection circuit 58 can improve the sensitivity of bypassing the ESD current. When the first P-type heavily-doped area 38 receives an input voltage lower than or equal to the grounding voltage as the reference voltage through the first pin 46, the detection circuit 58 turns off the parasitic field-effect transistor formed by the dielectric layer 54, the conductive gate 56, the N-type doped area 40, the P-type well 36', and the first N-type heavily-doped area 42 in response to the input voltage. The other features of the thirteenth embodiment have been described in the tenth embodiment previously so they will not be reiterated.

Figure 18:
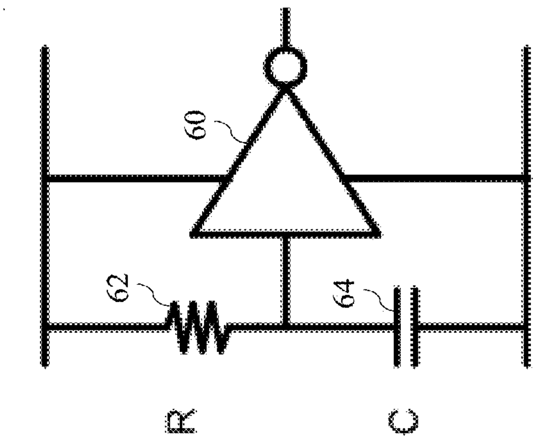
FIG. 18 is a schematic diagram illustrating an ESD detection circuit according to another embodiment of the present invention.

FIG. 18 is a schematic diagram illustrating an ESD detection circuit according to another embodiment of the present invention. Referring to FIG. 17 and FIG. 18, the detection circuit 58 may include an inverter 60, a resistor 62, and a capacitor 64. The output of the inverter 60 is coupled to the conductive gate 56. The resistor 62 is coupled between the external conductive wire 44 and the input of the inverter 60. The capacitor 64 is coupled between the input of the inverter 60 and the grounding voltage as the reference voltage. In such a case, the capacitor 64 is coupled to the second pin 48. In order to bypass the ESD current, a time constant formed by the resistor 62 and the capacitor 64 has 0.1~1 μs.

Figure 19:
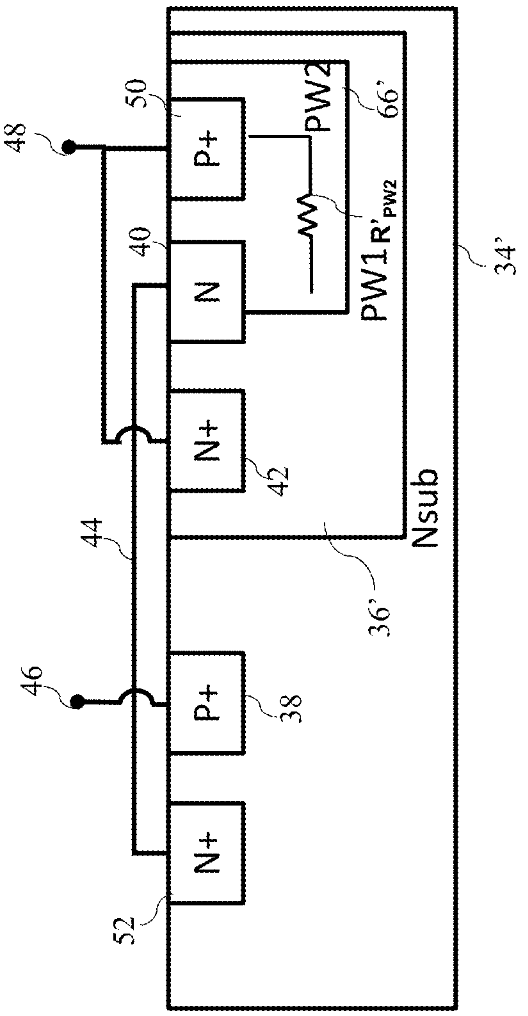
FIG. 19 is a cross-sectional view of an electrostatic discharge protection device according to a fourteenth embodiment of the present invention.

FIG. 19 is a cross-sectional view of an electrostatic discharge protection device according to a fourteenth embodiment of the present invention. Referring to FIG. 14 and FIG. 19, the fourteenth embodiment of the electrostatic discharge protection device is introduced as follows. The fourteenth embodiment is different from the tenth embodiment in that the fourteenth embodiment further includes a P-type doped well 66' formed in the P-type well 36'. The doping concentration of the P-type doped well 66' is greater than the doping concentration of the P-type well 36' and less than the doping concentration of the second P-type heavily-doped area 50. The second P-type heavily-doped area 50 is formed in the P-type doped well 66'. The P-type doped well 66' is directly contiguous to the N-type doped area 40. The parasitic resistance $R'_{PW2}$ of the P-type doped well 66' between the N-type doped area 40 and the second P-type heavily-doped area 50 is lower than the parasitic resistance $R'_{PW1}$ of the P-type well 36' between the N-type doped area 40 and the second P-type heavily-doped area 50. In order to reduce the parasitic resistance $R'_{PW2}$ of the P-type doped well 66', the bottom of the P-type doped well 66' may be deeper than that of each of the N-type doped area 40 and the second P-type heavily-doped area 50. Compared with the SCR of the tenth embodiment, the SCR of the fourteenth embodiment requires a higher trigger current to be turned on because the parasitic resistance $R_{PW2}$ is lower than the parasitic resistance $R_{PW1}$. The other features of the fourteenth embodiment have been described in the tenth embodiment previously so they will not be reiterated.

Figure 20:
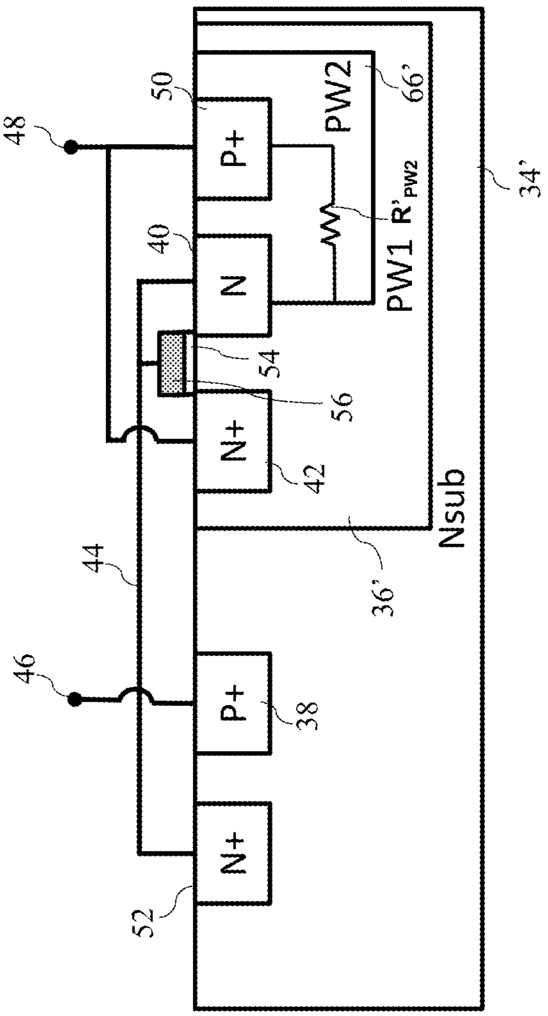
FIG. 20 is a cross-sectional view of an electrostatic discharge protection device according to a fifteenth embodiment of the present invention.

FIG. 20 is a cross-sectional view of an electrostatic discharge protection device according to a fifteenth embodiment of the present invention. Referring to FIG. 15 and FIG. 20, the fifteenth embodiment of the electrostatic discharge protection device is introduced as follows. The fifteenth embodiment is different from the eleventh embodiment in that the fifteenth embodiment further includes a P-type doped well 66' formed in the P-type well 36'. The doping concentration of the P-type doped well 66' is greater than the doping concentration of the P-type well 36' and less than the doping concentration of the second P-type heavily-doped area 50. The second P-type heavily-doped area 50 is formed in the P-type doped well 66'. The P-type doped well 66' is directly contiguous to the N-type doped area 40. The parasitic resistance $R'_{PW2}$ of the P-type doped well 66' between the N-type doped area 40 and the second P-type heavily-doped area 50 is lower than the parasitic resistance of the P-type well 36' between the N-type doped area 40 and the second P-type heavily-doped area 50. In order to reduce the parasitic resistance $R'_{PW2}$ of the P-type doped well 66', the bottom of the P-type doped well 66' may be deeper than that of each of the N-type doped area 40 and the second P-type heavily-doped area 50. Compared with the SCR of the eleventh embodiment, the SCR of the fifteenth embodiment requires a higher trigger current to be turned on because the parasitic resistance $R_{PW2}$ is lower than the parasitic resistance $R_{PW1}$. The other features of the fifteenth embodiment have been described in the eleventh embodiment previously so they will not be reiterated.

Figure 21:
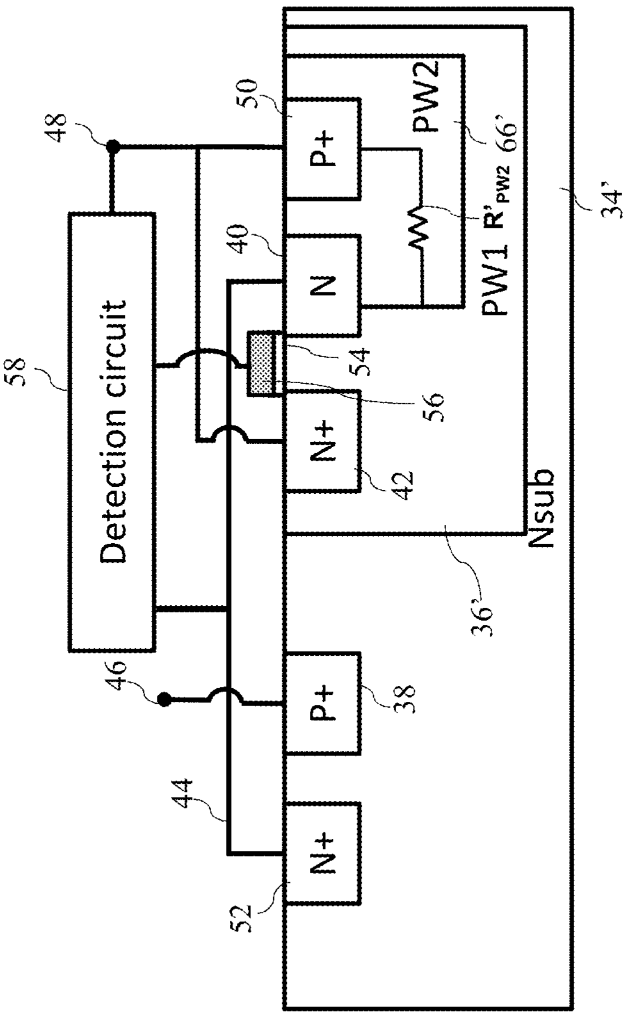
FIG. 21 is a cross-sectional view of an electrostatic discharge protection device according to a sixteenth embodiment of the present invention.

FIG. 21 is a cross-sectional view of an electrostatic discharge protection device according to a sixteenth embodiment of the present invention. Referring to FIG. 16 and FIG. 21, the sixteenth embodiment of the electrostatic discharge protection device is introduced as follows. The sixteenth embodiment is different from the twelfth embodiment in that the sixteenth embodiment further includes a P-type doped well 66' formed in the P-type well 36'. The doping concentration of the P-type doped well 66' is greater than the doping concentration of the P-type well 36' and less than the doping concentration of the second P-type heavily-doped area 50. The second P-type heavily-doped area 50 is formed in the P-type doped well 66'. The P-type doped well 66' is directly contiguous to the N-type doped area 40. The parasitic resistance $R'_{PW2}$ of the P-type doped well 66' between the N-type doped area 40 and the second P-type heavily-doped area 50 is lower than the parasitic resistance of the P-type well 36' between the N-type doped area 40 and the second P-type heavily-doped area 50. In order to reduce the parasitic resistance $R'_{PW2}$ of the P-type doped well 66', the bottom of the P-type doped well 66' may be deeper than that of each of the N-type doped area 40 and the second P-type heavily-doped area 50. Compared with the SCR of the twelfth embodiment, the SCR of the sixteenth embodiment requires a higher trigger current to be turned on because the parasitic resistance $R_{PW2}$ is lower than the parasitic resistance $R_{PW1}$. The other features of the sixteenth embodiment have been described in the twelfth embodiment previously so they will not be reiterated.

According to the embodiments provided above, the electrostatic discharge protection device couples the N-type well or the N-type substrate to the N-type doped area to have a low parasitic capacitance, a low clamping voltage, a low trigger voltage, and a high trigger current.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. An electrostatic discharge (ESD) protection device comprising:

a P-type substrate;

an N-type well formed in the P-type substrate;

a first P-type heavily-doped area formed in the N-type well;

an N-type doped area and a first N-type heavily-doped area formed in the P-type substrate, wherein the N-type doped area is coupled to the N-type well through an external conductive wire and the external conductive wire is decoupled to the first P-type heavily-doped area; and a second P-type heavily-doped area formed in the P-type substrate, wherein the N-type doped area is formed between the first N-type heavily-doped area and the second P-type heavily-doped area;

wherein the first P-type heavily-doped area is coupled to a first pin, the first pin is decoupled to the external conductive wire, and the first N-type heavily-doped area and the second P-type heavily-doped area are coupled to a second pin;

wherein the first N-type heavily-doped area is formed between the N-type doped area and the N-type well.

2. The electrostatic discharge protection device according to claim 1, further comprising a second N-type heavily-doped area formed in the N-type well, wherein the second N-type heavily-doped area is coupled to the N-type doped area through the external conductive wire.

3. The electrostatic discharge protection device according to claim 1, further comprising a P-type well formed in the P-type substrate, wherein a doping concentration of the P-type well is greater than a doping concentration of the P-type substrate and less than a doping concentration of the second P-type heavily-doped area, the second P-type heavily-doped area is formed in the P-type well, and the P-type well is directly contiguous to the N-type doped area.

4. The electrostatic discharge protection device according to claim 1, wherein the P-type substrate has a region between the N-type doped area and the first N-type heavily-doped area, a dielectric layer and a conductive gate are sequentially formed on the region, and the conductive gate is coupled to the external conductive wire.

5. The electrostatic discharge protection device according to claim 1, wherein the P-type substrate has a region between the N-type doped area and the first N-type heavily-doped area, a dielectric layer and a conductive gate are sequentially formed on the region, and the conductive gate is coupled to the first N-type heavily-doped area.

6. The electrostatic discharge protection device according to claim 1, further comprising an electrostatic discharge (ESD) detection circuit, the P-type substrate has a region between the N-type doped area and the first N-type heavily-doped area, a dielectric layer and a conductive gate are sequentially formed on the region, the ESD detection circuit is coupled to the external conductive wire, the conductive gate, and the first N-type heavily-doped area, the first P-type heavily-doped area is coupled to a first pin, the first N-type heavily-doped area is coupled to a second pin and is also coupled to a reference voltage, and when the first pin receives a positive electrostatic discharge (ESD) voltage higher than the reference voltage, the ESD detection circuit turns on a parasitic field-effect transistor formed by the dielectric layer, the conductive gate, the N-type doped area, the P-type substrate, and the first N-type heavily-doped area in response to the positive ESD voltage.

7. The electrostatic discharge protection device according to claim 6, wherein the ESD detection circuit comprises:

an inverter with an output thereof coupled to the conductive gate;

a resistor coupled between the external conductive wire and an input of the inverter; and a capacitor coupled between the input of the inverter and the reference voltage.

8. An electrostatic discharge (ESD) protection device comprising:

an N-type substrate;

a P-type well formed in the N-type substrate;

a first P-type heavily-doped area formed in the N-type substrate; and an N-type doped area and a first N-type heavily-doped area formed in the P-type well, wherein the N-type doped area is coupled to the N-type substrate through an external conductive wire and the external conductive wire is decoupled to the first P-type heavily-doped area.

9. The electrostatic discharge protection device according to claim 8, wherein the first P-type heavily-doped area is coupled to a first pin, the first pin is decoupled to the external conductive wire, and the first N-type heavily-doped area and the P-type well are coupled to a second pin.

10. The electrostatic discharge protection device according to claim 8, wherein the first N-type heavily-doped area is formed between the N-type doped area and the first P-type heavily-doped area.

11. The electrostatic discharge protection device according to claim 8, further comprising a second N-type heavily-doped area formed in the N-type substrate and the second N-type heavily-doped area is coupled to the N-type doped area through the external conductive wire.

12. The electrostatic discharge protection device according to claim 8, further comprising a second P-type heavily-doped area formed in the P-type well, wherein the N-type doped area is formed between the first N-type heavily-doped area and the second P-type heavily-doped area.

13. The electrostatic discharge protection device according to claim 8, wherein the P-type well has a region between the N-type doped area and the first N-type heavily-doped area, a dielectric layer and a conductive gate are sequentially formed on the region, and the conductive gate is coupled to the external conductive wire.

14. The electrostatic discharge protection device according to claim 8, wherein the P-type well has a region between the N-type doped area and the first N-type heavily-doped area, a dielectric layer and a conductive gate are sequentially formed on the region, and the conductive gate is coupled to the first N-type heavily-doped area.

15. The electrostatic discharge protection device according to claim 8, further comprising an electrostatic discharge (ESD) detection circuit, the P-type well has a region between the N-type doped area and the first N-type heavily-doped area, a dielectric layer and a conductive gate are sequentially formed on the region, the ESD detection circuit is coupled to the external conductive wire, the conductive gate, and the first N-type heavily-doped area, the first P-type heavily-doped area is coupled to a first pin, the first N-type heavily-doped area is coupled to a second pin and is also coupled to a reference voltage, and when the first pin receives a positive electrostatic discharge (ESD) voltage higher than the reference voltage, the ESD detection circuit turns on a parasitic field-effect transistor formed by the dielectric layer, the conductive gate, the N-type doped area, the P-type well, and the first N-type heavily-doped area in response to the positive ESD voltage.

16. The electrostatic discharge protection device according to claim 15, wherein the ESD detection circuit comprises:

an inverter with an output thereof coupled to the conductive gate;

a resistor coupled between the external conductive wire and an input of the inverter; and a capacitor coupled between the input of the inverter and the reference voltage.

* * * * *